United States Patent
Roy et al.

(10) Patent No.: US 9,548,116 B2
(45) Date of Patent: Jan. 17, 2017

(54) RESISTIVE MEMORY WITH PROGRAM VERIFY AND ERASE VERIFY CAPABILITY

(71) Applicant: FREESCALE SEMICONDUCTOR, INC., Austin, TX (US)

(72) Inventors: Anirban Roy, Austin, TX (US); Michael A. Sadd, Austin, TX (US)

(73) Assignee: NXP USA, INC., Austin, TX (US)

( * ) Notice: Subject to any disclaimer, the term of this patent is extended or adjusted under 35 U.S.C. 154(b) by 31 days.

(21) Appl. No.: 14/554,826

(22) Filed: Nov. 26, 2014

(65) Prior Publication Data
US 2016/0148685 A1 May 26, 2016

(51) Int. Cl.
*G11C 11/00* (2006.01)
*G11C 13/00* (2006.01)

(52) U.S. Cl.
CPC ....... *G11C 13/0069* (2013.01); *G11C 13/0002* (2013.01); *G11C 13/0064* (2013.01); *G11C 13/0097* (2013.01); *G11C 13/004* (2013.01); *G11C 2013/0054* (2013.01); *G11C 2013/0066* (2013.01); *G11C 2013/0078* (2013.01)

(58) Field of Classification Search
CPC ............. G11C 13/0069; G11C 13/0004; G11C 11/5678; G11C 11/5685
USPC .................................................. 365/148, 163
See application file for complete search history.

(56) References Cited

U.S. PATENT DOCUMENTS

| | | | |
|---|---|---|---|
| 5,532,964 A | 7/1996 | Cernea et al. | |
| 7,428,172 B2 | 9/2008 | Choy et al. | |
| 8,059,447 B2 | 11/2011 | Scheuerlein et al. | |
| 8,659,954 B1 | 2/2014 | Lewis et al. | |
| 2012/0008373 A1* | 1/2012 | Scheuerlein | G11C 7/22 365/148 |
| 2014/0071734 A1* | 3/2014 | Sugimae | G11C 13/0002 365/148 |

OTHER PUBLICATIONS

Chen, Highly Scalable Hafnium Oxide Memory with Improvements of Resistive Distribution and Read Disturb Immunity, 2009 IEEE International Electron Devices Meeting (IEDM), Dec. 7-9, 2009, pp. 105-108.

Higuchi, 50nm Hf02 Re-Ram with 50-Times Endurance Enhancement by Set/Reset Turnback Pulse & Verify Scheme, ISSDM, Nagoya, 2011, 2 pgs.

Kawahara, Filament Scaling Forming Technique and Level-Verify-Write Scheme with Endurance Over 107 Cycles in ReRam, ISSCC 2013, Paper 12.6, pp. 220-222.

(Continued)

*Primary Examiner* — Huan Hoang (57) ABSTRACT

A resistive non-volatile memory cell is programmed. A programming voltage is applied to a first terminal of the resistive non-volatile memory cell. Sensing, during the applying the programming voltage, determines if the resistive non-volatile memory cell has been programmed. Current is limited through the resistive non-volatile memory cell to a first magnitude. After a predetermined time, if the sensing has not detected that the resistive non-volatile memory cell has been programmed, the current through the resistive non-volatile memory cell is limited to a second magnitude greater than the first magnitude. The resistive non-volatile memory cell is also erased.

17 Claims, 7 Drawing Sheets

(56) References Cited

OTHER PUBLICATIONS

Lee, Evidence and solution of Over-RESET Problem for Hf0x Based Resistive Memory with Sub-ns Switching Speed and High Endurance, IEDM 2010, pp. 460-463.

Meng, Fast Step-Down Set Algorithm of Resistive Switching Memory with Low Programming Energy and Significant Reliability Improvement, Symposium on VLSI Technology Digest of Technical Papers, Jul. 2014, pp. 198-199, Shanghai, China.

* cited by examiner

RESISTIVE MEMORY WITH PROGRAM VERIFY AND ERASE VERIFY CAPABILITY

BACKGROUND

Field

This disclosure relates generally to semiconductor memory devices, and more specifically, to resistive memory with program and erase verify capability.

Related Art

Memories with resistive storage elements are under development across the semiconductor industry that are geared to replace conventional NVM devices, and in some cases even dynamic random access memory (DRAM) and RAM devices. The resistive memory devices include magnetoresistive random access memory (MRAM), Resistive random-access memory (RRAM or ReRAM), phase-change memory (PCM), among others. Most of the resistive memory devices are implemented in one transistor/one resistive element or one diode/one resistive element memory cell configurations, which provide minimal cell area but exhibit relatively slow read and write performance (e.g., approximately 30 nanoseconds or more per operation). Thus, resistive memory devices are not a viable substitute for much of the SRAM in a higher performance system where read/write operations occur within a few clock cycles unless the time required to perform program and erase operations is reduced. The reliability of the memory cells must be considered as schemes to reduce program and erase times are considered. While increased current and voltages may be used to speed operation, the level of current of a cell dictates the reliability during programming and the level of voltage of a cell dictates reliability during erase. Thus, the minimum necessary level of current and voltage would ideally be used during program and erase operation.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices and methods disclosed herein provide a resistive non-volatile memory (NVM) system that includes automatic program verify and automatic erase verify capability that operates concurrently with the program and erase operations. Thus the time required to perform program and erase operations is limited to the amount of time required to perform the program or erase operation. Additional time is not required to verify the program and erase operations after they are performed. Further, current and voltage is limited to a minimum required value during the program and erase operations and may be incremented only in the event that program or erase verify does not pass. The resistive memory device thus operates at high speed due to the concurrent verify operations and with high reliability due to the limited current and voltage values.

Figure 1:
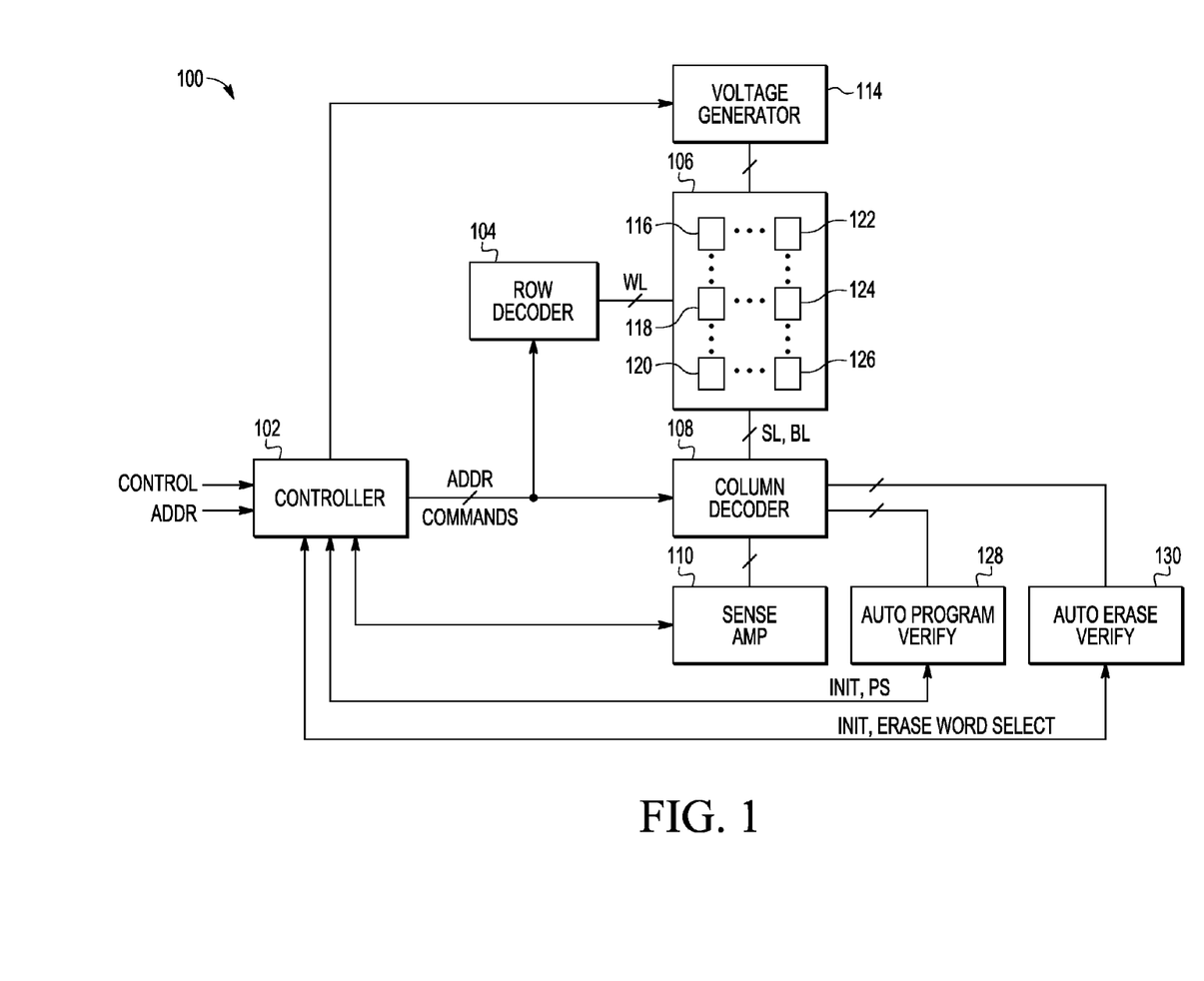
FIG. 1 is a block diagram of an integrated circuit device including a non-volatile memory (NVM) according to one embodiment.

FIG. 1 is a block diagram of an integrated circuit device or NVM device 100 according to one embodiment. Integrated circuit device 100 includes NVM array 106 coupled to controller 102, row decoder 104, voltage generator 114, and column decoder 108. Sense amplifiers 110, auto program verify module 128 and auto erase verify module 130 are coupled to column decoder 108. Controller 102 receives address and control signals from a processor or other component (not shown) and is coupled to row decoder 104 and column decoder 108. Data to be written to memory array 106 is provided from a processor or other component to column decoder 108. Word lines $WL_{0-N}$ are coupled between row decoder 104 and memory array 106.

Controller 102 controls program and erase procedures of the NVM array 106 through row decoder 104 and column decoder 108, such as in response to one or more processors. Controller 102 accesses memory cells, such as memory cells 116-126, within NVM array 106 by providing a row address to the row decoder 104 and a column address to column decoder 108. Data is written into or read from the NVM array 106 via column decoder 108.

Bit lines $BL_{0-J}$ and source lines $SL_{0-J}$ are coupled between column decoder 108 and memory array 106, and between column decoder 108 and sense amplifiers 110, auto program verify module 128 and auto erase verify module 130. Sense amplifiers 110 provide data from memory array 106 to one or more processors.

Auto program verify module 128 and auto erase verify module 130 continuously perform verify operations in parallel with respective program and erase operations. Verify modules 128, 130 avoid switching from program or erase operation modes to verify modes multiple times to complete the programming or erase. Verify modules 128, 130 also address the reliability concerns for resistive memory cells 116-126 by limiting the current during programming and voltage during erase. In addition, a distribution of memory cells 116-126 may require incrementally higher current and voltage during program and erase operations due to process, temperature, or other variations that affect operation of memory cells 116-126. Verify modules 128, 130 are thus equipped to increment program verify current and erase verify voltage as required to enhance reliable operation of memory cells 116-126.

Integrated circuit device 100 may be implemented as part of a System On Chip (SOC) or the like which includes at least one processor (not shown) coupled to the NVM device 100 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternative embodiment, the NVM device 100 is implemented alone in an integrated circuit without any other devices. In another alternative embodiment, NVM device 100 is part of a larger system on the integrated circuit.

Figure 2:
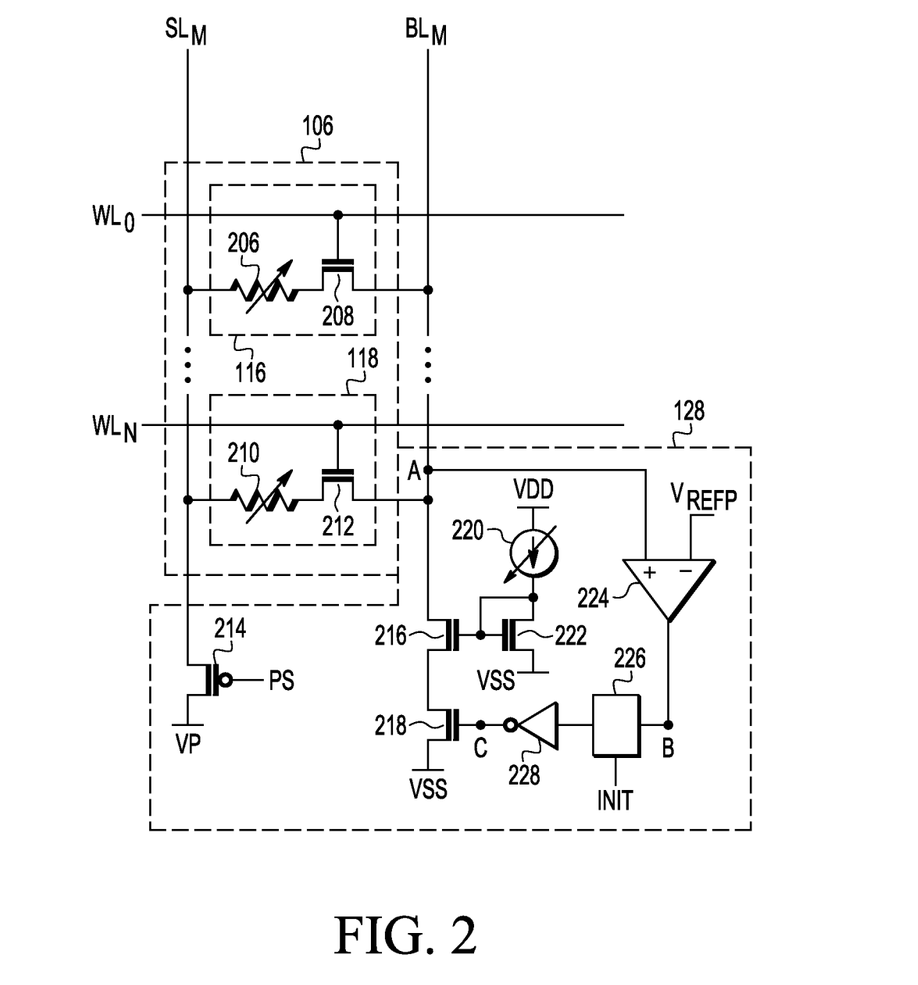
FIG. 2 is a schematic diagram of an embodiment of a portion of a memory array and auto program verify module that may be used in the integrated circuit device of FIG. 1.

FIG. 2 is a schematic diagram of an embodiment of a portion of memory array 106 and auto program verify module 128 that may be used in the integrated circuit device 100 of FIG. 1. Memory cell 116 includes programmable resistive element 206 and N-channel transistor 208. Resistive element 206 has a first terminal coupled to a source line $SL_M$ and a second terminal coupled to a first current electrode of transistor 208. A gate electrode of transistor 208 is coupled to a first word line $WL_O$ and a second current electrode of transistor 208 is coupled to a bit line $BL_M$.

Memory cell 118 includes bi-directional programmable resistive element 210 and N-channel transistor 212. Resistive element 210 has a first terminal coupled to a source line $SL_M$ and a second terminal coupled to a first current electrode of transistor 212. A gate electrode of transistor 212 is coupled to a second word line $WL_N$ and a second current electrode of transistor 212 is coupled to bit line $BL_M$.

Program verify module 128 includes P-channel transistor 214, N-channel transistors 216, 218, 222, programmable current source 220, comparator 224, flip-flop or latch circuit 226, and inverter 228. Transistor 214 includes a first current electrode coupled to source line $SL_M$, a gate electrode coupled to a program select signal PS, and a second current electrode coupled to program voltage source VP also referred to as a program signal). Transistor 216 includes a first current electrode coupled to bit line $BL_M$, a gate electrode coupled to a gate electrode of transistor 222, and a second current electrode coupled to a first current electrode of transistor 218. Transistor 218 further includes a gate electrode coupled to an output of inverter 228 and a second current electrode coupled to supply voltage VSS, which may be ground or other voltage that is less than supply voltage VDD.

Current source 220 includes a first terminal coupled to supply voltage VDD and a second terminal coupled to a first current electrode of transistor 222. The gate electrode of transistor 222 is also coupled to the first current electrode of transistor 222. A second current electrode of transistor 222 is coupled to supply voltage VSS.

A non-negating input of comparator 224 is coupled to bit line $BL_M$ and a negating input of comparator 224 is coupled to program reference voltage VREFP. An output of comparator 224 is coupled to an input to flip-flop unit 226. An output of flip-flop unit 226 is coupled to an input to inverter 228. An output of inverter 228 is coupled to the gate electrode of transistor 218.

Note that the connection between auto program verify module 128 and column decoder 108 is not shown to simplify FIG. 2. A switch or other suitable connection element may be included in column decoder 108 to couple auto program verify module 128 to memory array 106 during program and program verify operations.

Figure 3:
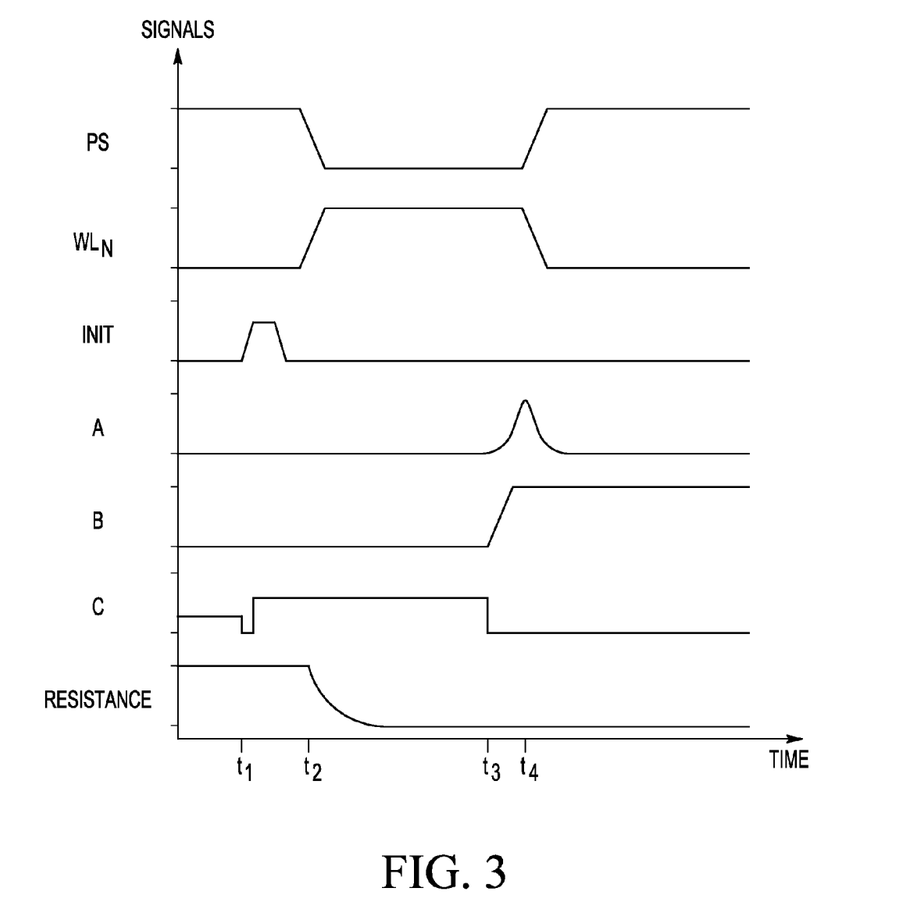
FIG. 3 is a timing diagram showing examples of states of signals that may be used in the auto program verify module of FIG. 2 during program and program verify operations.

Auto program verify module 128 operates concurrently with memory cells 116, 118 during a program operation. Referring to FIGS. 2 and 3, FIG. 3 is a timing diagram showing examples of states of signals that may be used in integrated circuit device 100 during program and program verify operations. At time t1, an initialization signal INIT is set to reset flip-flop unit 226 to output a low or "0" value. The output of flip-flop unit 226 is inverted to a high or "1" value by inverter 228, as shown at node C. Once flip-flop unit 226 is initialized, the word line select signal $WL_N$ is set high to enable memory cell 118 and the program select PS signal is set low at t2. The resistance state of resistive element 210 transitions asymptotically from high to low. At time t3, resistive element 210 has transitioned to a low resistance state, causing the voltage on bit line $BL_M$ at node A to increase from low to high. When the voltage at node A becomes greater than the program reference voltage VREFP, the output of comparator 224 at node B increases from low to high. The change in voltage at node B at the input to flip-flop unit 226 causes flip-flop unit 226 to latch high. In response to sensing that the resistive element 210 has been programmed, transistor 218 is placed in non-conductive mode to block current through the resistive element 210 to ground (or VSS). Once all resistive elements that are being concurrently programmed are sensed to be programmed, the word line signal $WL_N$ is deselected by returning to low and the program select signal PS returns to high at time t4. Flip-flop unit 226 can retain transistor 218 in non-conductive mode while other memory cells are programmed.

As resistive element 210 transitions to the low resistance state, the current through resistive element 210 will increase as the voltage at node A increases. Transistors 216, 222 are configured as a current mirror with a source electrode of transistor 222 coupled to supply voltage VSS to prevent the current through resistive element 210 from reaching a value higher than necessary to perform the program and program verify operations. Current supply 220 is programmable and the current limit can be incremented as required to provide sufficient current to perform the program and program verify operations reliably, as further described in connection with method 400 of FIG. 4.

Note that the program verify operation is performed using comparator 224 and flip-flop unit 226 concurrently with the program operation on resistive element 210. The current from current source 220 can be increased incrementally until resistive element 210 changes resistance state. Once the program operation is successful, the change in the voltage on bit line $BL_M$ is sensed by sense amplifiers 110 and by comparator 224. The change in the output of comparator 224 toggles flip-flop unit 226 and causes transistor 218 to be placed in a non-conducting mode. Current mirror including transistors 216 and 222 limits the current available to transistor 212 and resistive element 210, thereby preventing premature aging of transistor 212 and resistive element 210.

Figure 4:
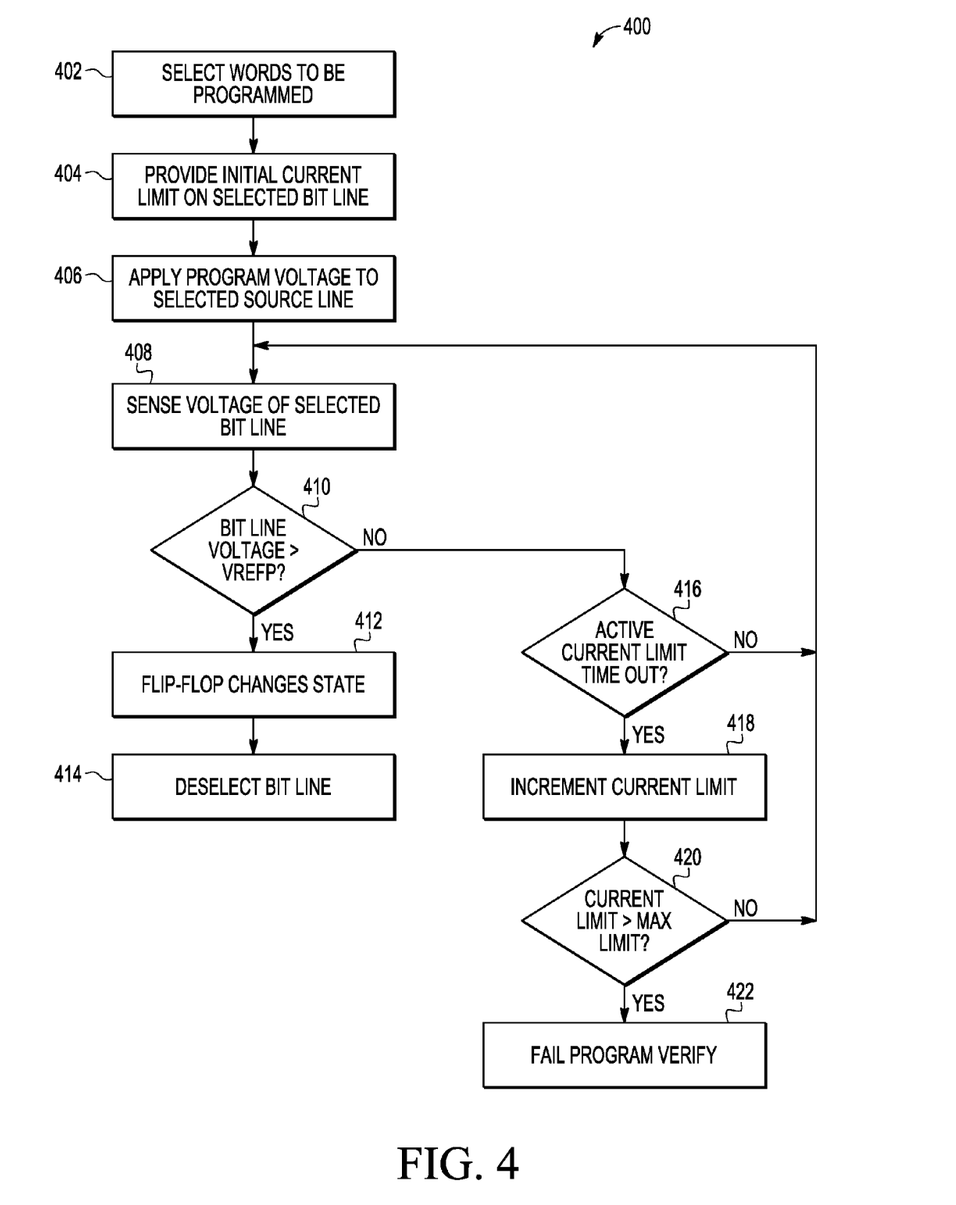
FIG. 4 is a flow diagram of an embodiment of a method that can be performed by the integrated circuit device of FIG. 1 during program and program verify operations.

Referring to FIGS. 1, 2 and 4, FIG. 4 is a flow diagram of an embodiment of a method 400 that can be performed by the integrated circuit device 100 of FIG. 1 during program and program verify operations. Data is stored in memory, such as integrated circuit device 100, in words that are made up of a number of bits, with each bit of data being stored in a corresponding memory cell 116, 118. Process 402 includes selecting one or more words (or number of memory cells 116, 118) to be programmed. The memory cells 116, 118 correspond to an address in memory array 106. The address is provided to row decoder 104 and column decoder 108, which translate the address to a selected row and column of memory array 106 to access a particular memory cell 116, 118.

Process 404 includes initializing the current source 220 to an initial value, typically a nominal or relatively low magnitude current to avoid subjecting resistive element 210 and transistor 212 to a higher current magnitude than required to perform the program and program verify operations. Current source 220 can be controlled by controller 102, program verify module 128, or other suitable component in device 100.

Process 406 includes applying program voltage to the selected source line $SL_M$. The program voltage is provided by voltage generator 114, which determines that amount of voltage to be used during program operations. Process 408 includes sensing the voltage on a corresponding selected bit line $BL_M$ by comparator 224. If the voltage on the selected bit line $BL_M$ is greater than the program reference voltage VREFP at comparator 224, the program and program verify operations have been successful and process 410 transitions to process 412 in which flip-flop unit 226 changes state. The change in state at flip-flop unit 226 places transistor 218 in non-conducting mode to deselect the selected bit line $BL_M$. If the voltage on the selected bit line $BL_M$ is not greater than the program reference voltage VREFP at comparator 224, the program and program verify operations have not been successful and process 410 transitions to process 416 to determine whether the program and program verify operations at the presently active current limit have been attempted for more than a specified period of time. If the presently active current limit has been used for the specified period of time, process 418 increments the current limit to a higher magnitude. The higher current limit allows higher current at resistive element 210 and transistor 212 during subsequent program and program verify operations. Process 420 then determines whether the incremented current is greater than a maximum current limit. If so, process 422 indicates that the program and program verify operations have failed for the selected bit. If the incremented current is not greater than the maximum limit, process 420 transitions to process 408 to repeat the program and program verify operations at the higher current limit.

Figure 5:
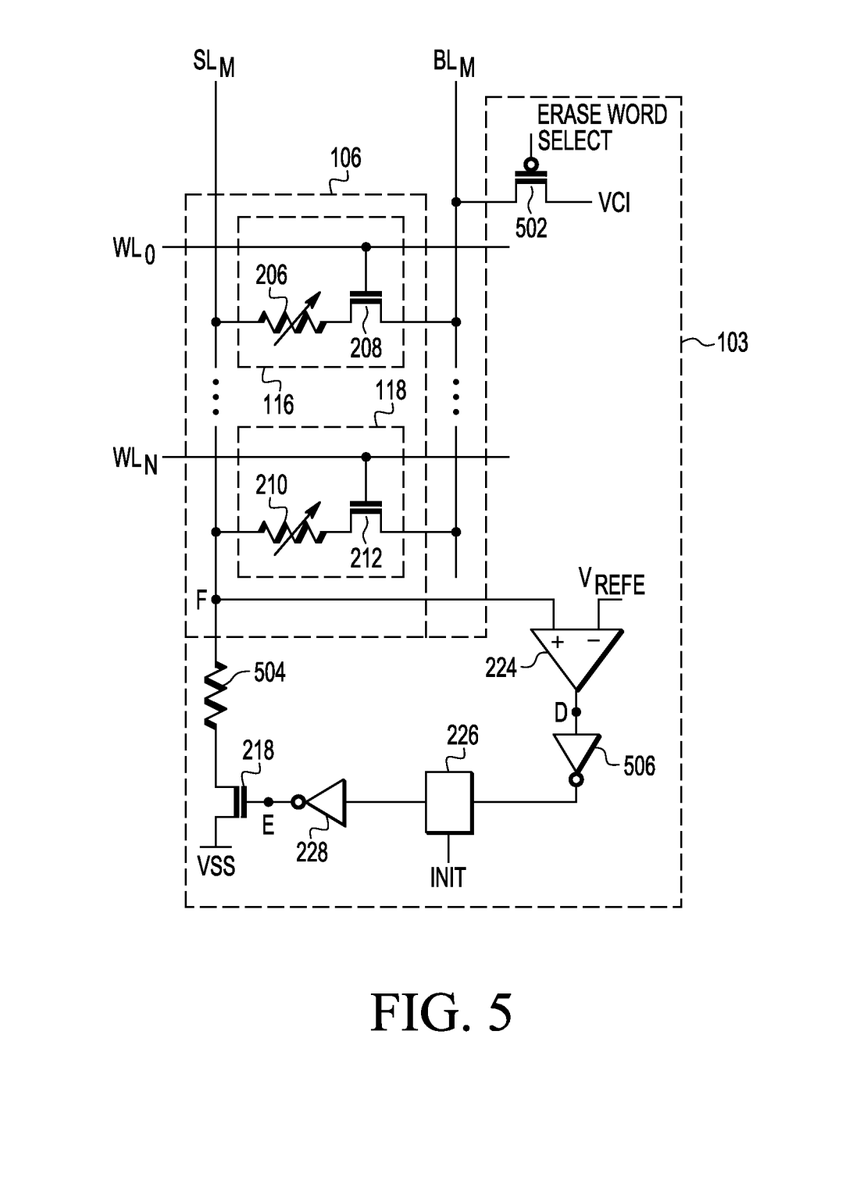
FIG. 5 is a schematic diagram of an embodiment of a portion of a memory array and auto erase verify module that may be used in the integrated circuit device of FIG. 1.

FIG. 5 is a schematic diagram of an embodiment of a portion of memory array 106 and auto erase verify module 130 that may be used in the integrated circuit device 100 of FIG. 1. Memory cells 116, 118 in memory array 106 are similar to memory cells 116, 118 shown and described in connection with FIG. 2. Erase verify module 130 includes P-channel transistor 502, impedance element 504 such as a resistor, N-channel transistor 218, comparator 224, inverter 506, flip-flop unit 226 and inverter 228. Note that N-channel transistor 218, comparator 224, flip-flop unit 226 and inverter 228 may be shared with program verify module 128, with switches (not shown) such as transistors and/or multiplexers being used to reconfigure connections, inputs and outputs between modules 128 and 130 depending on whether program or erase operations are being performed.

Transistor 502 includes a first current electrode coupled to bit line $BL_M$, a gate electrode coupled to an erase word select signal, and a second current electrode coupled to supply voltage limit VCI. A first terminal of impedance 504 is coupled to select line $SL_M$ and a second terminal of impedance 504 is coupled to a first current electrode of transistor 218. A second current electrode of transistor 218 is coupled to supply voltage VSS and a gate electrode of transistor 218 is coupled to the output of inverter 228 at node E. A non-negating input of comparator 224 is coupled to source line $SL_M$ at node F, which is at the first terminal of resistor 504, and a negating input to comparator 224 is coupled to an erase reference voltage VREFE. An output of comparator 224 is coupled to an input of inverter 506, and an output of inverter 306 is coupled to an input to flip-flop unit 226. An output of flip-flop unit 226 is coupled to an input of inverter 228, and the output of inverter 228 is coupled to the gate electrode of transistor 218. Flip-flop unit 226 can retain transistor 218 in non-conductive mode while other memory cells are erased.

Figure 6:
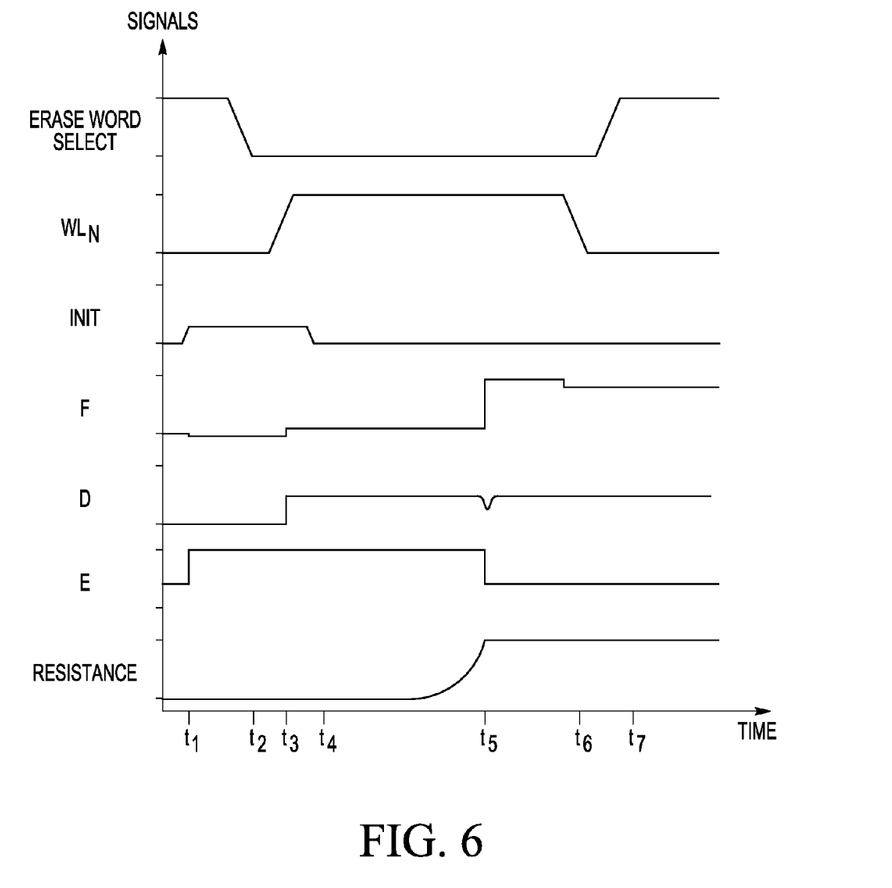
FIG. 6 is a timing diagram showing examples of states of signals that may be used in the auto erase verify module of FIG. 3 during erase and erase verify operations.

Auto erase verify module 130 operates concurrently with memory cells 116, 118 during an erase operation. Referring to FIGS. 5 and 6, FIG. 6 is a timing diagram showing examples of states of signals that may be used in the auto erase verify module 130 of FIG. 2 during erase and erase verify operations. At time t1, resistive element 210 is in a low resistance state, and an initialization signal INIT is provided to reset flip-flop unit 226 to a low state. The output of inverter 228 at node E goes from a low state to a high state, placing pull-down transistor 218 in conductive or active mode. Erase word select signal is set from a high value to a low value at time t2, placing transistor 502 in active mode to couple voltage limit VCI to bit line $BL_M$. At time t3, the word line signal WLN is asserted to a high value to enable memory cell 118, and the voltage output by comparator 224 transitions from low to high, indicating that the voltage at node F is greater than the erase reference voltage VREFE. The initialization signal at flip-flop unit 226 is de-asserted at time t4. Since word line signal $WL_N$ is asserted, transistor 212 is in conductive mode, allowing current to flow to resistive element 210. Resistive element 210 remains in a low resistance state until voltage limit VCI reaches a level that causes resistor 210 to transition from the low resistance state to a high resistance state at time t5. The voltage limit VCI can start at a relatively low level and be incremented in suitably sized steps until the voltage is sufficient to cause resistive element 210 to change states.

At time T5, the change in resistance of resistive element 210 from low to high causes a high voltage on source line $SL_M$, and further causing flip-flop unit 226 to latch at a high value. The output of inverter 228 transitions low at node E, which places transistor 218 in a non-conductive state. The word line signal $WL_N$ is de-asserted at time t6 and the erase word select signal transitions from low to high at time t7 to end the erase and erase verify operations.

Note that the connection between auto erase verify module 128 and column decoder 108 is not shown to simplify FIG. 5. A switch or other suitable connection element may be included in column decoder 108 to couple auto erase verify module 128 to memory array 106 during erase and erase verify operations.

Note that the erase verify operation is performed using comparator 224 and flip-flop unit 226 concurrently with the erase operation on resistive element 210. The erase voltage limit VCI can be increased incrementally until resistive element 210 changes resistance state. Once the erase operation is successful the change in voltage on source line $SL_M$ is sensed by comparator 224. The change in the output of comparator 224 toggles flip-flop unit 226 and causes transistor 218 to be placed in a non-conducting mode.

Figure 7:
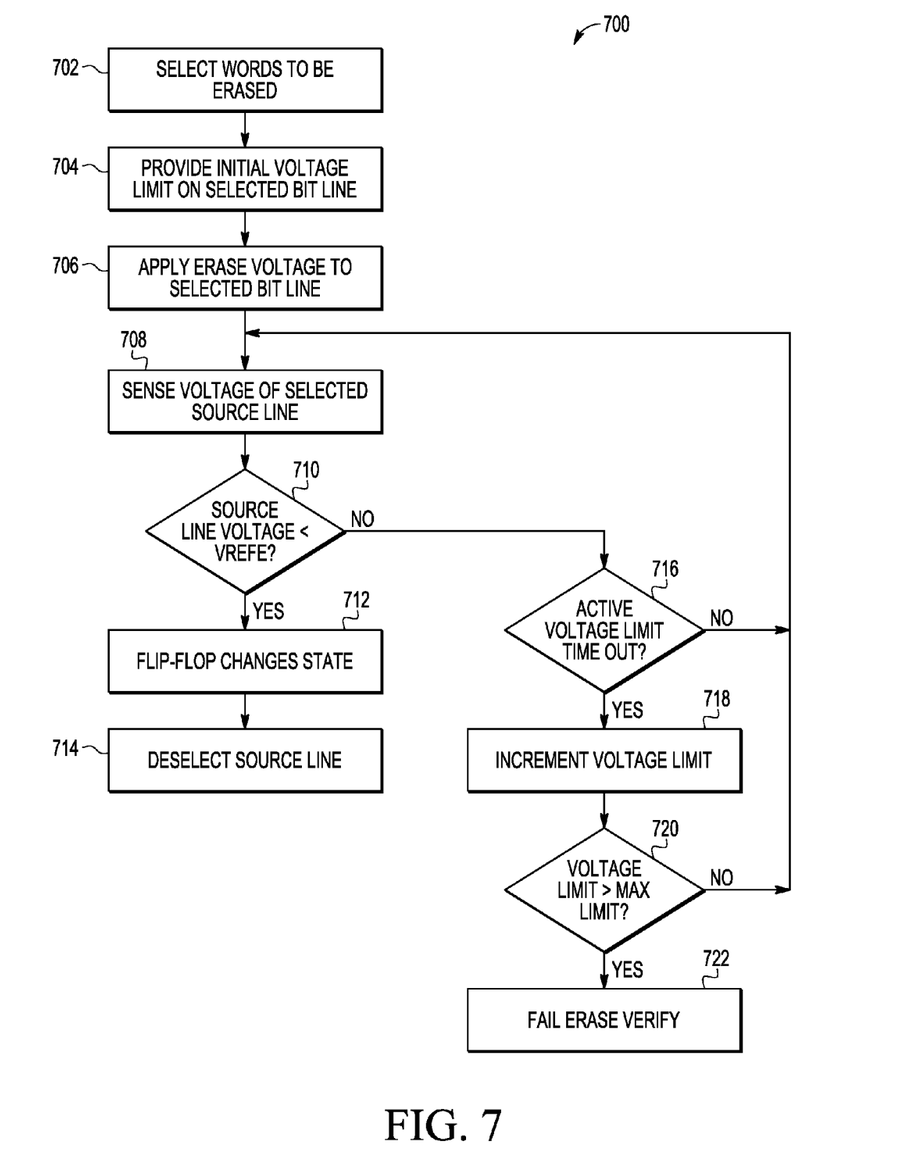
FIG. 7 is a flow diagram of an embodiment of a method that can be performed by the integrated circuit device of FIG. 1 during erase and erase verify operations.

Referring to FIGS. 1, 2 and 7, FIG. 7 is a flow diagram of an embodiment of a method 700 that can be performed by the integrated circuit device 100 of FIG. 1 during erase and erase verify operations. Data is stored in memory, such as integrated circuit device 100, in words that are made up of a number of bits, with each bit of data being stored in a corresponding memory cell 116, 118. Process 702 includes selecting one or more words to be erased. The address of the word(s) to be erased is translated to row (word line) and column (bit line and source line) selections by row decoder 14 and column decoder 108.

Process 704 includes initializing a limiting voltage limit VCI to a starting value, typically a nominal or relatively low magnitude voltage to avoid subjecting resistive element 210 and transistor 212 to a higher magnitude voltage than required to perform the erase and erase verify operations. The limiting voltage limit VCI can be provided by voltage generator 114.

Process 706 includes applying erase voltage to the selected bit line $BL_M$. Process 708 includes sensing the voltage on a corresponding selected source line $SL_M$ by comparator 224. If the voltage on the source line $SL_M$ is less than the erase reference voltage VREFE at comparator 224, the erase and erase verify operations have been successful and process 710 transitions to process 712 in which flip-flop unit 226 changes state. The change in state at flip-flop unit 226 places transistor 218 in non-conducting mode to decouple impedance 304 from between source line $SL_M$ and supply voltage VSS. If the voltage on the selected source line $SL_M$ is not greater than the erase reference voltage VREFE at comparator 224, the erase and erase verify operations have not been successful and process 710 transitions to process 716 to determine whether the erase and erase verify operations at the presently active voltage limit VCI have been attempted for more than a specified period of time. If the presently active voltage limit VCI has been used for the specified period of time, process 718 increments the voltage limit VCI to a higher magnitude. The higher voltage limit allows higher voltage at resistive element 210 and transistor 212 during subsequent erase and erase verify operations. Process 720 then determines whether the incremented voltage is greater than a maximum voltage limit. If so, process 722 indicates that the erase and erase verify operations have failed for the selected bit. If the incremented voltage limit is not greater than the maximum limit, process 720 transitions to process 708 to repeat the erase and erase verify operations at the higher voltage limit magnitude.

By now it should be appreciated that in some embodiments, there has been provided a method of programming a resistive non-volatile memory cell (118) that can comprise applying a programming voltage to a first terminal ($SL_M$, 210) of the resistive non-volatile memory cell; sensing (224), during the applying the programming voltage, if the resistive non-volatile memory cell has been programmed; limiting current (222, 216) through the resistive non-volatile memory cell to a first magnitude; and after a predetermined time (416), if the sensing has not detected that the resistive non-volatile memory cell has been programmed, limiting the current through the resistive non-volatile memory cell to a second magnitude (220) greater than the first magnitude (418).

In another aspect, the method can further comprise terminating the applying the programming voltage (t3 FIG. 3) in response to the sensing detecting that, during the applying the programming voltage, the resistive non-volatile memory cell has been programmed (410-414).

In another aspect, the resistive non-volatile memory cell comprises a programmable resistive element (210) and a switching transistor (212), the programmable resistive element is coupled to a source line, the switching transistor is coupled to a bit line, and the limiting the current is by coupling a current limiter to the bit line.

In another aspect, the method can further comprise erasing (FIGS. 3, 6) the resistive non-volatile memory cell in an erase mode wherein the erasing comprises applying a voltage limit to the bit line and coupling an impedance (504) between the source line and a supply voltage terminal.

In another aspect, the method can further comprise sensing, during the applying the voltage limit to the bit line, if the resistive non-volatile memory cell has been erased.

In another aspect, the method can further comprise, during the erase mode, initially enabling (T3, FIG. 6) the switching transistor after the applying the voltage limit.

In another aspect, the initially enabling the transistor after applying the voltage limit prevents the sensing, during the applying the voltage limit to the bit line, from obtaining an erroneous result.

In another aspect, decoupling the impedance from between the source line and a supply voltage terminal in response to the sensing, during the applying the voltage limit to the bit line, making a determination that the resistive non-volatile memory cell has been erased.

In another aspect, the method can further comprise blocking current (FIG. 3, t3) through the resistive non-volatile memory cell to ground in response to the sensing detecting that, during the applying the programming voltage, the resistive non-volatile memory cell has been programmed.

In another embodiment, a method of erasing a resistive non-volatile memory cell (118) can comprise applying a voltage limit (VCI) to a first terminal (thru $BL_M$) of the resistive non-volatile memory cell; coupling an impedance (504) between a second terminal of the resistive non-volatile memory cell and a supply voltage terminal; sensing a state of the memory cell (t5) by sensing a voltage on the second terminal of the resistive non-volatile memory cell; and enabling the resistive non-volatile memory cell (FIG. 3 $WL_M$, t3) after the applying the voltage limit and after the coupling the impedance.

In another aspect, the resistive non-volatile memory cell can comprise a programmable resistive element (210) and a switching transistor (212), the switching transistor is coupled to a word line, and the enabling the resistive non-volatile memory cell is in response to the word line being enabled.

In another aspect, the method can further comprise decoupling the impedance (FIG. 6, t5) from between the second terminal of the resistive non-volatile memory cell and the supply voltage terminal in response to the sensing determining that the resistive non-volatile memory cell has been erased while the applying the voltage limit to the first terminal of the resistive non-volatile memory cell is occurring.

In another aspect, the decoupling uses a flip-flop (226) to retain the decoupling while other resistive non-volatile memory cells may be erased.

In another aspect, the method can further comprise increasing a magnitude of the voltage limit (VCI) if the resistive non-volatile memory cell has not been erased after a predetermined time.

In another aspect, the method can further comprise programming the resistive non-volatile memory cell, wherein the programming comprises: applying a program signal (VP) to the first terminal ($SL_M$) of the memory cell; coupling the second terminal of the memory cell to a current limiter (220, 222, 216) set to limit current to a first magnitude; sensing ((224), during the applying the program signal and the coupling the second terminal, when the resistive non-volatile memory cell has been programmed; and changing (220) the current limiter to limit the current to a second magnitude greater than the first magnitude.

In still another embodiment, a memory (100) can comprise a resistive non-volatile memory cell (118) having an enabling terminal coupled to a word line ($WL_M$), a first terminal coupled to a bit line, and a second terminal coupled to a source line; an auto program verify module (128) coupled to the resistive non-volatile memory cell during a program mode that applies a program signal (VP) to the resistive non-volatile memory cell, determines if the resistive non-volatile memory cell has been programmed during application of the program signal, terminates application of the program signal in response to a determination that the resistive non-volatile memory cell has been programmed (t3), provides a current limiter (216, 220, 222) that initially provides a limit to the current through the resistive non-volatile memory cell to a first magnitude and increases the limit to the current through the resistive non-volatile memory cell to a second magnitude during the application of the program signal if the program has not occurred after a predetermined time; and an auto erase verify module (130) coupled to the resistive non-volatile memory cell during an erase mode that applies a voltage limit to the resistive non-volatile memory cell and determines if the resistive non-volatile memory cell has been erased while the voltage limit is applied.

In another aspect, the auto program verify module can comprise a transistor (214) for coupling the program voltage to the source line.

In another aspect, the auto program verify module can be further characterized by the limiter comprising a current mirror (216, 220, 222) that is coupled between the bit line and a supply voltage terminal and is decoupled from between the bit line and supply voltage terminal in response to the determination that the resistive non-volatile memory cell has been programmed.

In another aspect, the auto erase verify module can be further characterized by initially (t3, FIG. 6) enabling the word line during the erase mode after (t2) the voltage limit has been applied.

In another aspect, the auto erase verify module can be further characterized by further comprising an impedance (304) coupled between the source line and a supply voltage terminal that is decoupled from between the source line and the supply voltage terminal in response to a determination (t5, FIG. 6) that the resistive non-volatile memory cell has been erased.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of programming a resistive non-volatile memory cell, comprising:
   applying a programming voltage to a first terminal of the resistive non-volatile memory cell;
   sensing, during the applying the programming voltage, if the resistive non-volatile memory cell has been programmed;
   limiting current through the resistive non-volatile memory cell to a first magnitude; and
   after a predetermined time, if the sensing has not detected that the resistive non-volatile memory cell has been programmed, limiting the current through the resistive non-volatile memory cell to a second magnitude greater than the first magnitude,
   wherein the resistive non-volatile memory cell comprises a programmable resistive element and a switching transistor, the programmable resistive element is coupled to a source line, the switching transistor is coupled to a bit line, and the limiting the current is by coupling a current limiter to the bit line, and
   erasing the resistive non-volatile memory cell in an erase mode wherein the erasing comprises applying a voltage limit to the bit line and coupling an impedance between the source line and a supply voltage terminal.

2. The method of claim 1, further comprising:
   terminating the applying the programming voltage in response to the sensing detecting that, during the applying the programming voltage, the resistive non-volatile memory cell has been programmed.

3. The method of claim 1, further comprising sensing, during the applying the voltage limit to the bit line, if the resistive non-volatile memory cell has been erased.

4. The method of claim 3, further comprising, during the erase mode, initially enabling the switching transistor after the applying the voltage limit.

5. The method of claim 3, wherein the initially enabling the transistor after applying the voltage limit prevents the sensing, during the applying the voltage limit to the bit line, from obtaining an erroneous result.

6. The method of claim 3, wherein:
   decoupling the impedance from between the source line and a supply voltage terminal in response to the sensing, during the applying the voltage limit to the bit line, making a determination that the resistive non-volatile memory cell has been erased.

7. A method of programming a resistive non-volatile memory cell, comprising:
applying a programming voltage to a first terminal of the resistive non-volatile memory cell;
sensing, during the applying the programming voltage, if the resistive non-volatile memory cell has been programmed;
limiting current through the resistive non-volatile memory cell to a first magnitude; and
after a predetermined time, if the sensing has not detected that the resistive non-volatile memory cell has been programmed, limiting the current through the resistive non-volatile memory cell to a second magnitude greater than the first magnitude,
wherein blocking current through the resistive non-volatile memory cell to ground in response to detecting that, during the applying the programming voltage, the resistive non-volatile memory cell has been programmed.

8. A method of erasing a resistive non-volatile memory cell, comprising:
applying a voltage limit to a first terminal of the resistive non-volatile memory cell;
coupling an impedance between a second terminal of the resistive non-volatile memory cell and a supply voltage terminal;
sensing a state of the memory cell by sensing a voltage on the second terminal of the resistive non-volatile memory cell; and
enabling the resistive non-volatile memory cell after the applying the voltage limit and after the coupling the impedance.

9. The method of claim 8, wherein the resistive non-volatile memory cell comprises a programmable resistive element and a switching transistor, the switching transistor is coupled to a word line, and the enabling the resistive non-volatile memory cell is in response to the word line being enabled.

10. The method of claim 8, further comprising:
decoupling the impedance from between the second terminal of the resistive non-volatile memory cell and the supply voltage terminal in response to the sensing determining that the resistive non-volatile memory cell has been erased while the applying the voltage limit to the first terminal of the resistive non-volatile memory cell is occurring.

11. The method of claim 10, wherein the decoupling uses a flip-flop to retain the decoupling while other resistive non-volatile memory cells may be erased.

12. The method of claim 8, further comprising increasing a magnitude of the voltage limit if the resistive non-volatile memory cell has not been erased after a predetermined time.

13. The method of claim 8 further comprising programming the resistive non-volatile memory cell, wherein the programming comprises:
applying a program signal to the first terminal of the memory cell;
coupling the second terminal of the memory cell to a current limiter set to limit current to a first magnitude;
sensing, during the applying the program signal and the coupling the second terminal, when the resistive non-volatile memory cell has been programmed; and
changing the current limiter to limit the current to a second magnitude greater than the first magnitude.

14. A memory, comprising:
a resistive non-volatile memory cell having an enabling terminal coupled to a word line, a first terminal coupled to a bit line, and a second terminal coupled to a source line;
an auto program verify module coupled to the resistive non-volatile memory cell during a program mode that applies a program signal to the resistive non-volatile memory cell, determines if the resistive non-volatile memory cell has been programmed during application of the program signal, terminates application of the program signal in response to a determination that the resistive non-volatile memory cell has been programmed, provides a current limiter that initially provides a limit to the current through the resistive non-volatile memory cell to a first magnitude and increases the limit to the current through the resistive non-volatile memory cell to a second magnitude during the application of the program signal if the program has not occurred after a predetermined time; and
an auto erase verify module coupled to the resistive non-volatile memory cell during an erase mode that applies a voltage limit to the resistive non-volatile memory cell and determines if the resistive non-volatile memory cell has been erased while the voltage limit is applied, wherein the auto erase verify module is further characterized by initially enabling the word line during the erase mode after the voltage limit has been applied.

15. The memory of claim 14, wherein the auto program verify comprises:
a transistor for coupling the program voltage to the source line.

16. The memory of claim 15, wherein the auto program verify module is further characterized by the current limiter comprising a current mirror that is coupled between the bit line and a supply voltage terminal and is decoupled from between the bit line and supply voltage terminal in response to the determination that the resistive non-volatile memory cell has been programmed.

17. The memory circuit of claim 14, wherein the auto erase verify module is further characterized by further comprising an impedance coupled between the source line and a supply voltage terminal that is decoupled from between the source line and the supply voltage terminal in response to a determination that the resistive non-volatile memory cell has been erased.

* * * * *